US010727792B1

(12) United States Patent
Chen

(10) Patent No.: US 10,727,792 B1
(45) Date of Patent: Jul. 28, 2020

(54) VACUUM TUBE AND TRANSISTOR AMPLIFIER NATURAL SOUND FIELD TONE DIVIDING SYSTEM

(71) Applicant: ECHOWELL ELECTRONIC CO., LTD., New Taipei (TW)

(72) Inventor: Hsi-Hsien Chen, New Taipei (TW)

(73) Assignee: ECHOWELL ELECTRONIC CO., LTD., New Taipei (TW)

( * ) Notice: Subject to any disclaimer, the term of this patent is extended or adjusted under 35 U.S.C. 154(b) by 0 days.

(21) Appl. No.: 16/454,292

(22) Filed: Jun. 27, 2019

(51) Int. Cl.
| H03F 3/21 | (2006.01) |
| G10H 3/14 | (2006.01) |
| H03F 3/19 | (2006.01) |
| H03F 3/181 | (2006.01) |
| H03H 7/01 | (2006.01) |

(52) U.S. Cl.
CPC ............. *H03F 3/21* (2013.01); *G10H 3/14* (2013.01); *H03F 3/181* (2013.01); *H03F 3/19* (2013.01); *H03H 7/0161* (2013.01); *H03F 2200/549* (2013.01)

(58) Field of Classification Search
CPC ... H03F 3/21; H03F 3/181; H03F 3/19; H03F 2200/549; G10H 3/14; H03H 7/0161
USPC ...... 381/103, 111, 120, 123; 310/10, 53, 84, 310/124 R, 250, 286, 295
See application file for complete search history.

(56) References Cited

U.S. PATENT DOCUMENTS

| 4,346,349 A * | 8/1982 | Yokoyama ............ H03F 1/0233 330/10 |
| 8,654,995 B2 * | 2/2014 | Silber .................... H04B 1/207 381/123 |
| 9,306,510 B1 * | 4/2016 | Robling .................. H03F 3/181 |
| 2005/0094829 A1 * | 5/2005 | Cordell .................... H04R 3/08 381/103 |
| 2005/0094830 A1 * | 5/2005 | Stanley ................... H04R 3/14 381/111 |
| 2014/0002188 A1 * | 1/2014 | Chen .................. H01L 21/8249 330/250 |
| 2018/0309420 A1 * | 10/2018 | La Grou .................. H03F 3/68 |

* cited by examiner

*Primary Examiner* — Vivian C Chin
*Assistant Examiner* — Friedrich Fahnert
(74) *Attorney, Agent, or Firm* — Locke Lord LLP; Tim Tingkang Xia, Esq.

(57) ABSTRACT

A vacuum tube and transistor amplifier natural sound field tone dividing system includes: a front-end circuit for receiving and processing an input signal to thereby generate an audio signal; a transistor power amplifying circuit connected to the front-end circuit and adapted to process a low-frequency signal in the audio signal and play the low-frequency signal with a first player; and a vacuum tube power amplifying circuit connected to the front-end circuit and adapted to process a medium-frequency signal and a high-frequency signal in the audio signal, play the medium-frequency signal with a second player, and play the high-frequency signal with a third player, wherein the transistor power amplifying circuit and the vacuum tube power amplifying circuit are independent of each other.

7 Claims, 4 Drawing Sheets

VACUUM TUBE AND TRANSISTOR AMPLIFIER NATURAL SOUND FIELD TONE DIVIDING SYSTEM

BACKGROUND OF THE INVENTION

Field of the Invention

The present disclosure relates to a vacuum tube and transistor amplifier natural sound field tone dividing system and, more particularly, to a vacuum tube and transistor amplifier natural sound field tone dividing system with preferred sound field magnitude.

Description of the Prior Art

Vacuum tubes and transistors demonstrate wide variety in terms of electrical operation, production, and audio quality. Vacuum tubes are voltage driving components that enable high audio quality of medium- and high-frequency sound. Transistors are current driving components good at low-frequency driving. Considering that a vacuum tube and a transistor operate out of phase with each other, the prior art does not disclose applying a vacuum tube and a transistor to self-contained electronic tone dividing systems. As a result, the prior art does not allow the same system to attain preferred medium- and high-frequency sound with a vacuum tube and attain preferred low-frequency sound with a transistor simultaneously. In view of this, there is a demand for a vacuum tube and transistor amplifier natural sound field tone dividing system which uses a vacuum tube to process medium- and high-frequency sound and uses a transistor to process low-frequency sound.

SUMMARY OF THE INVENTION

To overcome the aforesaid drawback of the prior art, an aspect of the present disclosure provides a vacuum tube and transistor amplifier natural sound field tone dividing system which uses a vacuum tube to process medium- and high-frequency sound and uses a transistor to process low-frequency sound.

In the aforesaid aspect, the present disclosure provides a vacuum tube and transistor amplifier natural sound field tone dividing system, comprising: a front-end circuit for receiving and processing an input signal to thereby generate an audio signal; a transistor power amplifying circuit connected to the front-end circuit and adapted to process a low-frequency signal in the audio signal and play the low-frequency signal with a first player; and a vacuum tube power amplifying circuit connected to the front-end circuit and adapted to process a medium-frequency signal and a high-frequency signal in the audio signal, play the medium-frequency signal with a second player, and play the high-frequency signal with a third player, wherein the transistor power amplifying circuit and the vacuum tube power amplifying circuit are independent of each other.

In the preferred embodiment of the present disclosure, the front-end circuit receives the input signal from one of a television system, a cellular Bluetooth playing system, and an audio disk player playing system.

In the preferred embodiment of the present disclosure, the transistor power amplifying circuit comprises a low-pass filtering circuit connected to the front-end circuit and adapted to perform low-pass processing on the audio signal from the front-end circuit so as to generate the low-frequency signal.

In the preferred embodiment of the present disclosure, the transistor power amplifying circuit comprises a transistor power amplifier for amplifying output power of the low-frequency signal.

In the preferred embodiment of the present disclosure, the transistor power amplifying circuit comprises a preamplifier connected between the low-pass filtering circuit and the transistor power amplifier and adapted to amplify the output power of the low-frequency signal and then provide the amplified output power to the transistor power amplifier.

In the preferred embodiment of the present disclosure, the vacuum tube power amplifying circuit comprises a high-pass pure vacuum tube power amplifying circuit for generating the medium-frequency signal and the high-frequency signal according to the audio signal and amplifying output power of the medium-frequency signal and the high-frequency signal.

In the preferred embodiment of the present disclosure, the vacuum tube power amplifying circuit does not have a high-pass filter independent of the high-pass pure vacuum tube power amplifying circuit.

In the preferred embodiment of the present disclosure, the vacuum tube power amplifying circuit comprises a passive tone dividing circuit connected between the high-pass pure vacuum tube power amplifying circuit and the third player and adapted to process the high-frequency signal so as to generate a high-pitch signal and provide the high-pitch signal to the third player.

In the preferred embodiment of the present disclosure, the vacuum tube power amplifying circuit enables a sound transmission delay relative to the transistor power amplifying circuit.

The present disclosure is rendered comprehensible and clear after its aforesaid aspects and any other aspects are illustrated by non-restrictive, specific embodiment below and depicted by accompanying drawings.

DETAILED DESCRIPTION OF THE EMBODIMENTS

Figure 1:
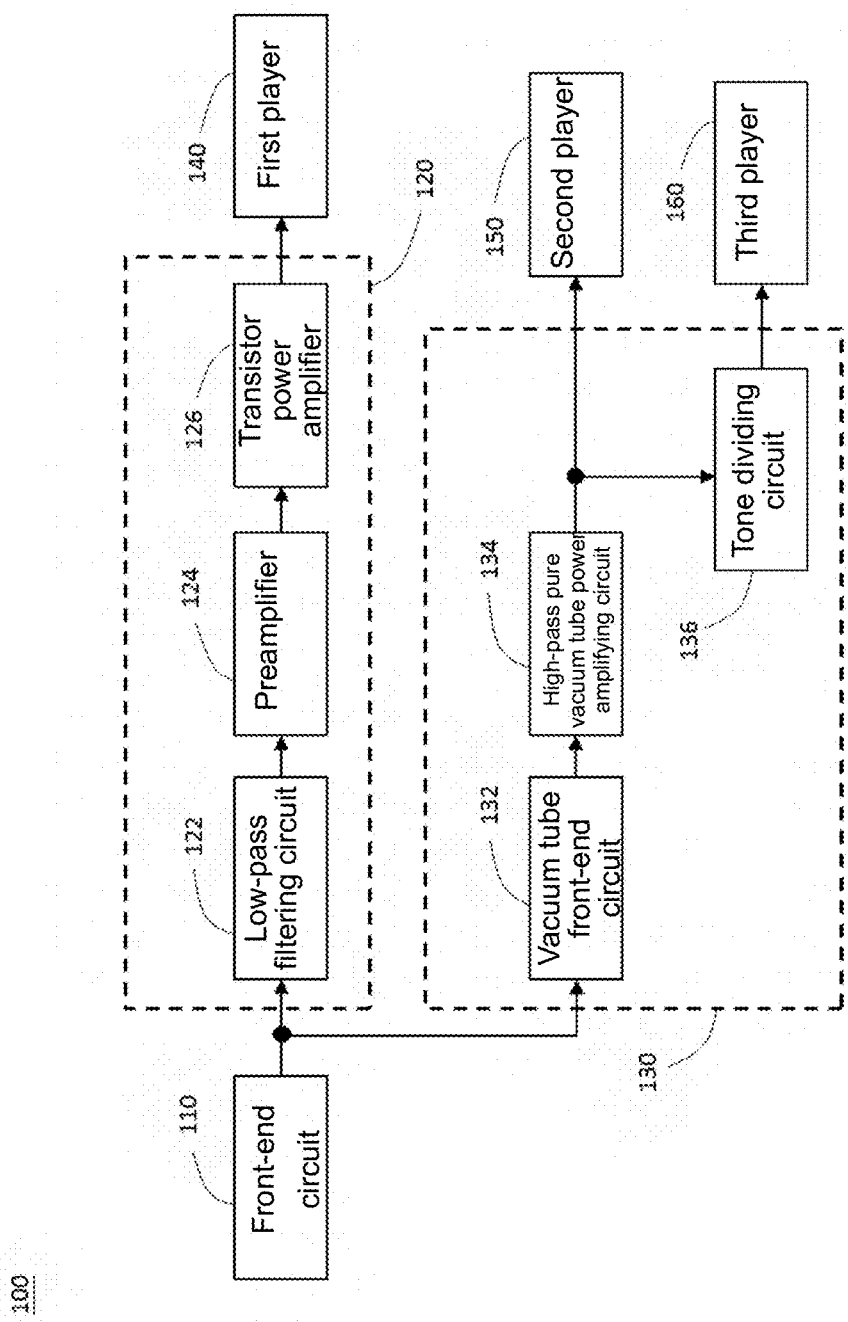
FIG. 1 is a block diagram of a vacuum tube and transistor amplifier natural sound field tone dividing system according to a specific embodiment of the present disclosure.

Referring to FIG. 1, there is shown a block diagram of a vacuum tube and transistor amplifier natural sound field tone dividing system according to a specific embodiment of the present disclosure. In the embodiment illustrated by FIG. 1, a vacuum tube and transistor amplifier natural sound field tone dividing system 100 comprises a front-end circuit 110, a transistor power amplifying circuit 120 and a vacuum tube power amplifying circuit 130. The transistor power amplifying circuit 120 is connected to the front-end circuit 110. The vacuum tube power amplifying circuit 130 is connected to the front-end circuit 110. The transistor power amplifying circuit 120 and the vacuum tube power amplifying circuit 130 are independent of each other. The vacuum tube power amplifying circuit 130 enables a transmission delay relative to the transistor power amplifying circuit 120. For instance, in a specific embodiment, the electron transit time between the cathode and the anode of the vacuum tube is around $10^{-9}$ second, whereas the time of conduction from the emitter to the collector of the transistor is $10^{-19}$ second. Hence, there is a delay of around 10 ρs to 1 ms in sound transmission between the vacuum tube power amplifying circuit 130 and the transistor power amplifying circuit 120. In a specific embodiment, the front-end circuit 110 receives an input signal from a television system, a cellular Bluetooth playing system, or an audio disk player playing system. Hence, the advantage of a greater sound field is attained (that is, the sound field is augmented, because the operation of the vacuum tube power amplifying circuit 130 and the operation of the transistor power amplifying circuit 120 are out of phase with each other), because of a delay in sound transmission between the vacuum tube power amplifying circuit 130 and the transistor power amplifying circuit 120. The vacuum tube and transistor amplifier natural sound field tone dividing system 100 is not only applicable to the television system, cellular Bluetooth playing system, and audio disk player playing system, but is also applicable to a Bi-Amp system, a soundbar, and an electronic tone dividing speaker as needed, as well as a system whose operation greatly requires sound field performance, such as a television playing system, and a home cinema system, but the present disclosure is not limited thereto. In a specific embodiment, the vacuum tube and transistor amplifier natural sound field tone dividing system 100 employs the natural phenomenon of conventional delay and thereby attains a broad, great sound field, so as to upgrade sound field-dependent products. Furthermore, the present disclosure broadens sound field performance in natural environment and allows the vacuum tube to serve as a voltage driving component better in terms of medium- and high-frequency sound.

Figure 2:
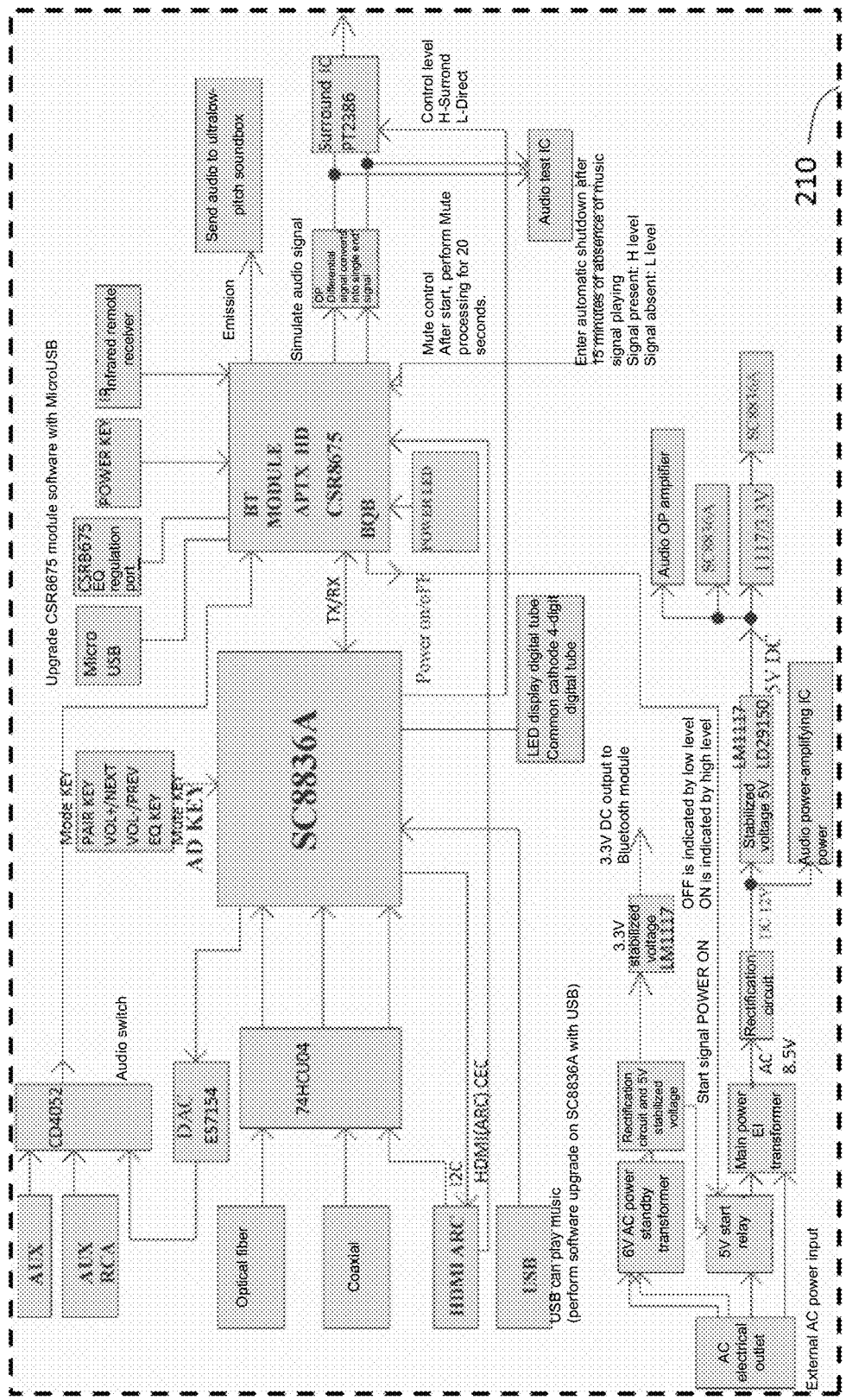
FIG. 2 is a block diagram of a front-end circuit according to a specific embodiment of the present disclosure.

In the embodiment illustrated by FIG. 1, the front-end circuit 110 receives and processes the input signal to generate an audio signal (see FIG. 2, a front-end circuit 210 of FIG. 2 is a specific embodiment of a front-end circuit). The transistor power amplifying circuit 120 processes a low-frequency signal in an audio signal, and a first player 140 plays the low-frequency signal. The vacuum tube power amplifying circuit 130 processes a medium-frequency signal and a high-frequency signal in the audio signal. A second player 150 plays the medium-frequency signal. A third player 160 plays the high-frequency signal. Hence, the vacuum tube and transistor amplifier natural sound field tone dividing system 100 uses the transistor power amplifying circuit 120 and the first player 140 to attain preferred low-pitch output and uses the vacuum tube power amplifying circuit 130, the second player 150 and the third player 160 to attain preferred medium- and high-pitch output. In a specific embodiment, the first player 140 comprises at least one low-pitch player. In a specific embodiment, the second player 150 is a medium-pitch player, and the third player 160 is a high-pitch player. In a specific embodiment, the first player 140 is a low-pitch speaker unit, the second player 150 is a medium-pitch speaker unit, and the third player 160 is a high-pitch speaker unit.

In the embodiment illustrated by FIG. 1, the transistor power amplifying circuit 120 comprises a low-pass filtering circuit 122, a preamplifier 124 and a transistor power amplifier 126. The low-pass filtering circuit 122 connects to the front-end circuit 110 and performs low-pass processing on the audio signal from the front-end circuit 110 so as to generate a low-frequency signal from the audio signal. The preamplifier 124 is connect between the low-pass filtering circuit 122 and the transistor power amplifier 126, amplifies output power of the low-frequency signal, and supplies the amplified output power to the transistor power amplifier 126. The transistor power amplifier 126 is connected between the preamplifier 124 and the first player 140 and amplifies the output power of the low-frequency signal. In another specific embodiment, the amplification gain of the preamplifier 124 can be adjusted as needed. In yet another specific embodiment, the transistor power amplifier 126 uses chip TDA7377 or TDA7375, but the present disclosure is not limited thereto.

In the embodiment illustrated by FIG. 1, the vacuum tube power amplifying circuit 130 comprises a high-pass pure vacuum tube power amplifying circuit 134 and a passive tone dividing circuit 136. The high-pass pure vacuum tube power amplifying circuit 134 generates a medium-frequency signal and a high-frequency signal from the audio signal and amplifies the output power of the medium-frequency signal and high-frequency signal. The passive tone dividing circuit 136 is connected between the high-pass pure vacuum tube power amplifying circuit 134 and the third player 160. The passive tone dividing circuit 136 processes the high-frequency signal to thereby generate a high-pitch signal and then provide the high-pitch signal to the third player 160. Since the high-pass pure vacuum tube power amplifying circuit 134 is already capable of high-pass filtering, the vacuum tube power amplifying circuit 130 does not need any high-pass filter which is independent of the high-pass pure vacuum tube power amplifying circuit 134. In a specific embodiment, the vacuum tube power amplifying circuit 130 is for use in vacuum tube 12AX7B, but the present disclosure is not limited thereto. In a specific embodiment, the high-pass pure vacuum tube power amplifier 134 is an active high-pass pure vacuum tube power amplifier. The active high-pass pure vacuum tube power amplifier is capable of limiting low frequency and reducing signal coupling capacitors of all levels, cathode bypass capacitors of all levels and audio output transformers in the circuit. Hence, the active high-pass pure vacuum tube power amplifier is a high-pass pure vacuum tube power amplifier with a −6 dB gradient, thereby incurring low cost and being of small size.

In a specific embodiment, the vacuum tube power amplifying circuit 130 comprises a vacuum tube front-end circuit 132 for performing front-end processing on the audio signal from the front-end circuit 110. The vacuum tube front-end circuit 132 is connected between the front-end circuit 110 and the high-pass pure vacuum tube power amplifying circuit 134.

Figure 3A:
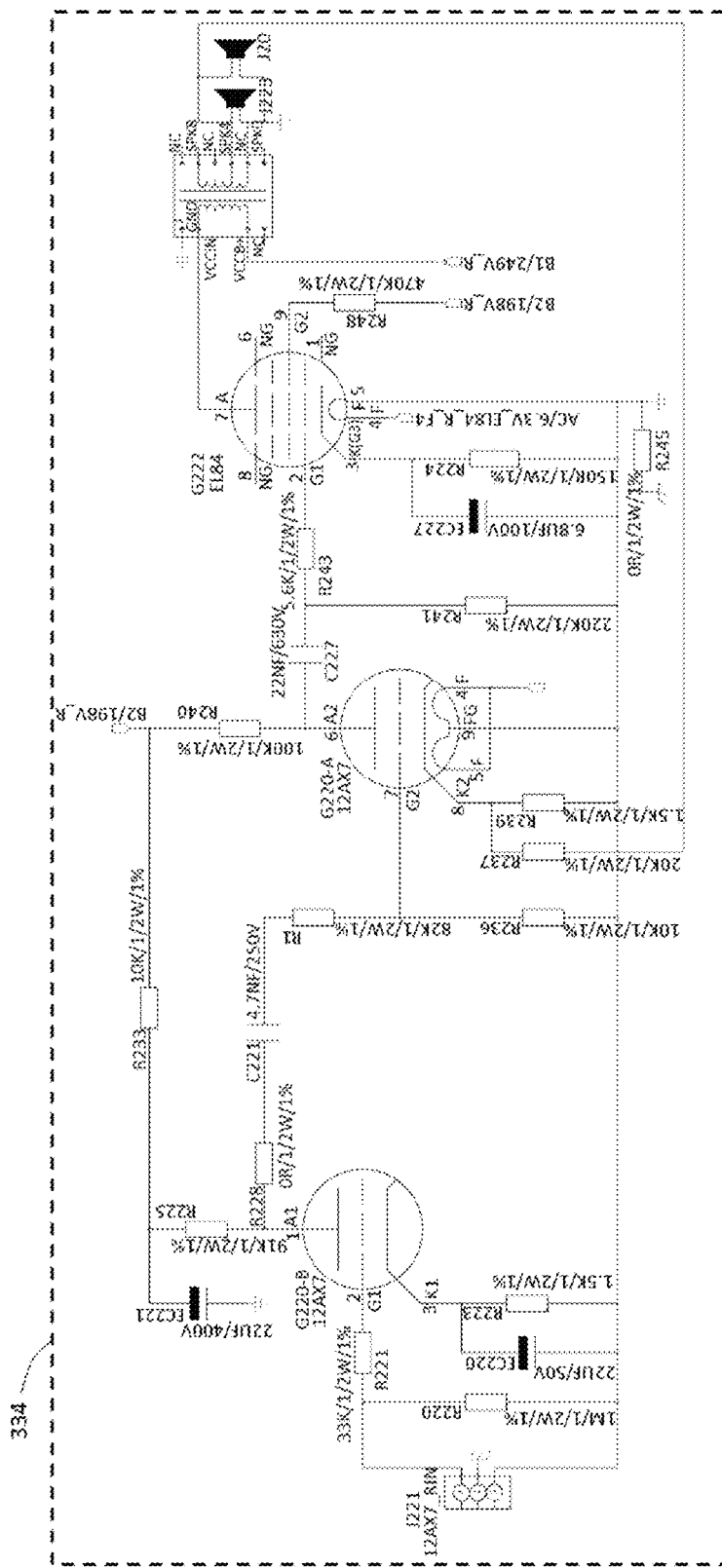
FIG. 3A is a circuit diagram of a high-pass pure vacuum tube power amplifying circuit according to a specific embodiment of the present disclosure.
Figure 3B:
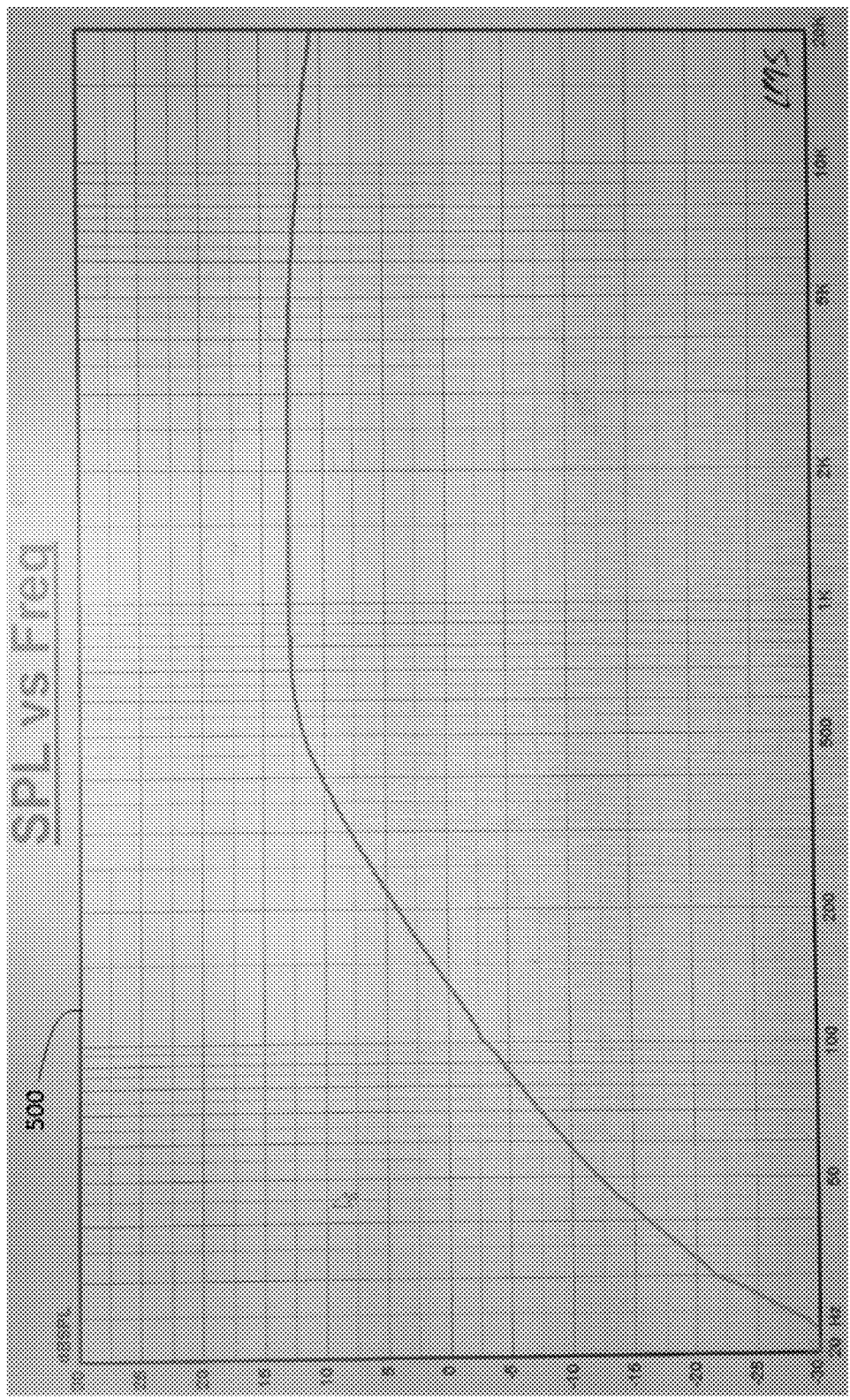
FIG. 3B is a schematic view of results of a response test conducted with the high-pass pure vacuum tube power amplifying circuit of FIG. 3A.

Referring to FIG. 3A and FIG. 3B, FIG. 3A is a circuit of a high-pass pure vacuum tube power amplifying circuit according to a specific embodiment of the present disclosure, and FIG. 3B shows response test results 500 of the high-pass pure vacuum tube power amplifying circuit 334 in FIG. 3A. As the test results of FIG. 3B indicate, the high-pass pure vacuum tube power amplifying circuit 334 of FIG. 3A is capable of high-pass filtering, and thus the front end of the high-pass pure vacuum tube power amplifying circuit 334 need not be connected to a high-pass filter which is independent of the high-pass pure vacuum tube power amplifying circuit 334.

The vacuum tube and transistor amplifier natural sound field tone dividing system of the present disclosure is described above and depicted by the accompanying drawings. The embodiments of the present invention are merely illustrative of the present disclosure. Persons skilled in the art may make various changes to the embodiments of the present disclosure without departing from the spirit and scope of the present disclosure, and the changes must be deemed falling within the scope of the present disclosure. Hence, the embodiments of the present disclosure are not restrictive of the present disclosure. Therefore, the scope of the protection of rights of the present disclosure shall be defined by the appended claims.

What is claimed is:

1. A vacuum tube and transistor amplifier natural sound field tone dividing system, comprising:
   a front-end circuit for receiving and processing an input signal to thereby generate an audio signal;
   a transistor power amplifying circuit connected to the front-end circuit and adapted to process a low-frequency signal in the audio signal and play the low-frequency signal with a first player; and
   a vacuum tube power amplifying circuit connected to the front-end circuit and adapted to process a medium-frequency signal and a high-frequency signal in the audio signal, play the medium-frequency signal with a second player, and play the high-frequency signal with a third player,
   wherein the transistor power amplifying circuit and the vacuum tube power amplifying circuit are independent of each other;
   wherein the vacuum tube power amplifying circuit comprises a high-pass pure vacuum tube power amplifying circuit for generating the medium-frequency signal and the high-frequency signal according to the audio signal and amplifying output power of the medium-frequency signal and the high-frequency signal;
   wherein the vacuum tube power amplifying circuit comprises a passive tone dividing circuit connected between the high-pass pure vacuum tube power amplifying circuit and the third player and adapted to process the high-frequency signal so as to generate a high-pitch signal and provide the high-pitch signal to the third player.

2. The vacuum tube and transistor amplifier natural sound field tone dividing system of claim 1, wherein the front-end circuit receives the input signal from one of a television system, a cellular Bluetooth playing system, and an audio disk player playing system.

3. The vacuum tube and transistor amplifier natural sound field tone dividing system of claim 1, wherein the transistor power amplifying circuit comprises a low-pass filtering circuit connected to the front-end circuit and adapted to perform low-pass processing on the audio signal from the front-end circuit so as to generate the low-frequency signal.

4. The vacuum tube and transistor amplifier natural sound field tone dividing system of claim 3, wherein the transistor power amplifying circuit comprises a transistor power amplifier for amplifying output power of the low-frequency signal.

5. The vacuum tube and transistor amplifier natural sound field tone dividing system of claim 4, wherein the transistor power amplifying circuit comprises a preamplifier connected between the low-pass filtering circuit and the transistor power amplifier and adapted to amplify the output power of the low-frequency signal and then provide the amplified output power to the transistor power amplifier.

6. The vacuum tube and transistor amplifier natural sound field tone dividing system of claim 1, wherein the vacuum tube power amplifying circuit does not have a high-pass filter independent of the high-pass pure vacuum tube power amplifying circuit.

7. The vacuum tube and transistor amplifier natural sound field tone dividing system of claim 1, wherein the vacuum tube power amplifying circuit enables a sound transmission delay relative to the transistor power amplifying circuit.

* * * * *